(12) United States Patent
Lee et al.

(10) Patent No.: US 11,221,562 B2
(45) Date of Patent: Jan. 11, 2022

(54) RETICLE AND METHOD OF DETECTING INTACTNESS OF RETICLE STAGE USING THE SAME

(71) Applicant: TAIWAN SEMICONDUCTOR MANUFACTURING CO., LTD., Hsinchu (TW)

(72) Inventors: Chia-Yu Lee, Hsinchu (TW); Tao-Hsin Chen, Tainan (TW); Ching-Juinn Huang, Changhua County (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 269 days.

(21) Appl. No.: 16/354,015

(22) Filed: Mar. 14, 2019

(65) Prior Publication Data
US 2020/0292932 A1 Sep. 17, 2020

(51) Int. Cl.
*G03F 7/20* (2006.01)
*H01L 21/683* (2006.01)
(Continued)

(52) U.S. Cl.
CPC ............... *G03F 7/707* (2013.01); *G03F 1/68* (2013.01); *G03F 7/7085* (2013.01); *G03F 7/70158* (2013.01); *G03F 7/70741* (2013.01); *G03F 7/70783* (2013.01); *H01L 21/681* (2013.01); *H01L 21/6833* (2013.01)

(58) Field of Classification Search
CPC ..... G03F 1/38; G03F 1/42; G03F 1/44; G03F 1/68; G03F 1/82; G03F 1/84; G03F 7/70783; G03F 7/70916; G03F 7/7085; G03F 7/70141; G03F 7/70158; G03F 7/70683; G03F 7/70616; G03F 7/7065; G03F 7/70666; G03F 7/70691; G03F 7/707; G03F 7/70708; G03F 7/70716; G03F 7/70733; G03F 7/70741; G03F 7/708; G03F 7/70808; G03F 7/70825; G03F 7/70833; G03F 7/70841; G03F 7/70866; G03F 7/70908–70941; G03F 7/70975; G03F 7/70991; G03F 9/7073; G03F 9/7076; G03F 9/708; G03F 9/7084; G03F 9/7088;
(Continued)

(56) References Cited

U.S. PATENT DOCUMENTS

5,646,413 A * 7/1997 Nishi ................. G03F 7/70358
250/548
5,945,239 A * 8/1999 Taniguchi ............... G03F 7/706
430/30
(Continued)

*Primary Examiner* — Christina A Riddle
(74) *Attorney, Agent, or Firm* — Maschoff Brennan (57) ABSTRACT

In some embodiments, a reticle structure is provided. The reticle structure includes a reticle stage and a reticle mounted on the reticle stage. The reticle stage includes plural first burls and plural second burls, in which the second burls are disposed on a center of the reticle stage and the first burls disposed on an edge of the reticle stage such that the first burls surround the second burls. The reticle includes a base material and a pattern layer overlying the base material. The base material is secured on the first and second burls of the reticle stage. The pattern layer includes plural first gratings, and each of the first burls is vertically aligned with one of the first gratings.

20 Claims, 7 Drawing Sheets

(51) Int. Cl.
*H01L 21/68* (2006.01)
*G03F 1/68* (2012.01)

(58) Field of Classification Search
CPC ..... G03F 9/7096; G03F 9/7011; G01B 11/16; H01L 21/681; H01L 21/6833
USPC .......... 355/30, 52–55, 67–77; 356/600–613, 356/614–620, 625–640, 237.1–237.6, 356/356–399; 430/5, 20, 30
See application file for complete search history.

(56) References Cited

U.S. PATENT DOCUMENTS

| | | | | |
|---|---|---|---|---|
| 6,842,247 | B1* | 1/2005 | Wehrens | G03F 7/705 |
| | | | | 356/400 |
| 7,333,175 | B2* | 2/2008 | Baselmans | G03F 7/706 |
| | | | | 355/53 |
| 2004/0036850 | A1* | 2/2004 | Tsukamoto | G03F 7/707 |
| | | | | 355/72 |
| 2007/0146708 | A1* | 6/2007 | Hagiwara | G03F 9/7076 |
| | | | | 356/401 |
| 2014/0340663 | A1* | 11/2014 | Scaccabarozzi | G03F 7/70916 |
| | | | | 355/67 |
| 2016/0291482 | A1* | 10/2016 | Shih | G03F 7/70641 |

\* cited by examiner

RETICLE AND METHOD OF DETECTING INTACTNESS OF RETICLE STAGE USING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

In a photolithograph process for manufacturing a semiconductor device, a reticle of an extreme ultraviolet (EUV) lithography system is usually applied to form desired pattern onto a photoresist layer over a semiconductor wafer. In the scaling-down process, damages on the reticle may affect quality of the semiconductor device more significantly. The damages on the reticle can be resulted from a variety of factors, and a method for finding out and distinguishing these factors in time is required, so as to tackle the problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A photolithograph process is involved in a semiconductor manufacturing process, in which a light source within a lithography apparatus provides a light beam which is incident upon a lithographic reticle and is reflected as reflected beam directed toward a photoresist layer formed over a semiconductor wafer, so as to form a desired pattern on the photoresist layer. In the lithography apparatus, the lithographic reticle is mounted on plural burls of an electrostatic chuck (hereinafter referred to as an e-chuck), in which problems such as particles adhering to the burls or damages of the burls may occur, and affect the reticle alignment and cause damages to the lithographic reticle. Both poor reticle alignment and the damages of the lithographic reticle possibly result in insufficient quality of the patterned photoresist layer. However, these problems are not easily detected. Typically, the reticle alignment is checked ex-situ by overlaying a patterned photoresist layer onto a reference wafer having a predetermined pattern, in which the patterned photoresist layer is formed by a reference reticle having the predetermined pattern that is the same as that of the reference wafer. The reference wafer is then transferred to another apparatus to develop an alignment residual map which defines a degree of overlay between the predetermined pattern of the reference wafer and the patterned photoresist layer. An overlay along x-axis, an overlay along y axis and a compensative residue are defined in the alignment residual map. However, the alignment residual map cannot precisely point out which part of the lithography apparatus (EUV lithography system) causes poor alignment residues. For example, the poor alignment residues may be resulted from problems of lens, the reticle or the e-chuck. Furthermore, intactness of the burls cannot be thoroughly detected by the alignment residues because a number of alignment residues investigated in the alignment residual map is much less than a number of the burls of the e-chuck. In addition, demonstrating the alignment residual map is time-consuming. Therefore, an in-situ method that can precisely detect the intactness of the burls of the e-chuck is required.

Embodiments of the present disclosure are directed to providing a reticle and a method of detecting intactness of a reticle stage by using the reticle. In some embodiments, the reticle includes a pattern layer that has plural gratings. At least some of the burls of the reticle stage are aligned with one of the gratings, such that intactness of the burls can be detected by the gratings using an optical imaging technique. In some embodiments, a reticle having a predetermined pattern and the gratings surrounding the predetermined pattern is provided, such that the burls may be detected in-situ when the semiconductor manufacturing process is performed, in which the predetermined pattern is used for patterning the semiconductor wafer. Because the intactness of the burls are detected using an optical imaging technique, a development operation is not required, and costs as well as time for the detection may be reduced. Furthermore, the detection method using the reticle of the present disclosure can be directly performed in the lithography apparatus (i.e. in-situ) before, during or after the photolithography process is performed. Therefore, the intactness of the burls can be detected more frequently, such that the quality of the patterned photoresist layer on the semiconductor wafer can be improved.

The term of "precisely detect" indicates that the intactness of the each of burls can be individually investigated.

The term of "lithographic reticle" indicates a reticle used to form a patterned photoresist layer over the semiconductor wafer during a semiconductor manufacturing process.

The term of "detecting intactness of the burls" indicates that situations such as whether there are particles adhering to the burls or whether the burls are damaged are detected.

Figure 1:
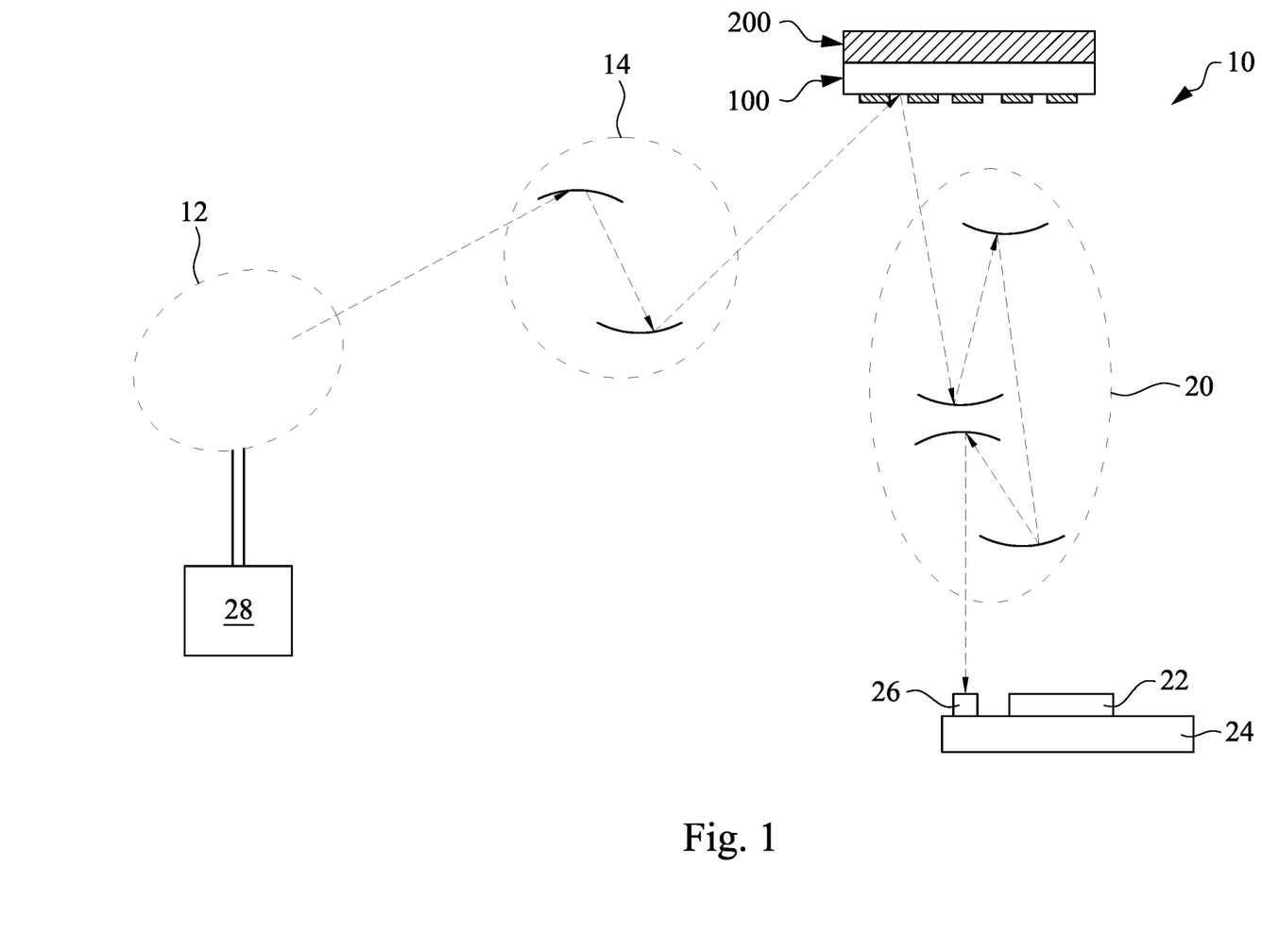
FIG. 1 is a schematic and diagrammatic view of a lithography system in accordance with some embodiments of the present disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a light source 12, an illuminator 14, a reticle stage 200, a reticle 100, a projection optics module (or projection optics box (POB)) 20, a substrate stage 24 and a transmission image sensor (TIS) 26, in accordance with some embodiments. The elements of the lithography system 10 can be added to or omitted, and the disclosure should not be limited by the embodiment.

The light source 12 is configured to generate light having a wavelength ranging between about 1 nm and about 100 nm. In one particular example, the light source 12 generates an EUV light with a wavelength range centered at about 13.5 nm. Accordingly, the light source 12 is also referred to as EUV light source. However, it should be understood that the light source 12 is not limited to emitting EUV light. The light source 12 can be utilized to perform any high-intensity photon emission from excited target material.

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto a reticle stage 200, particularly to the reticle 100 secured on the reticle stage 200. In the present embodiment where the light source 12 generates light in the EUV wavelength range, reflective optics is employed.

Figure 2:
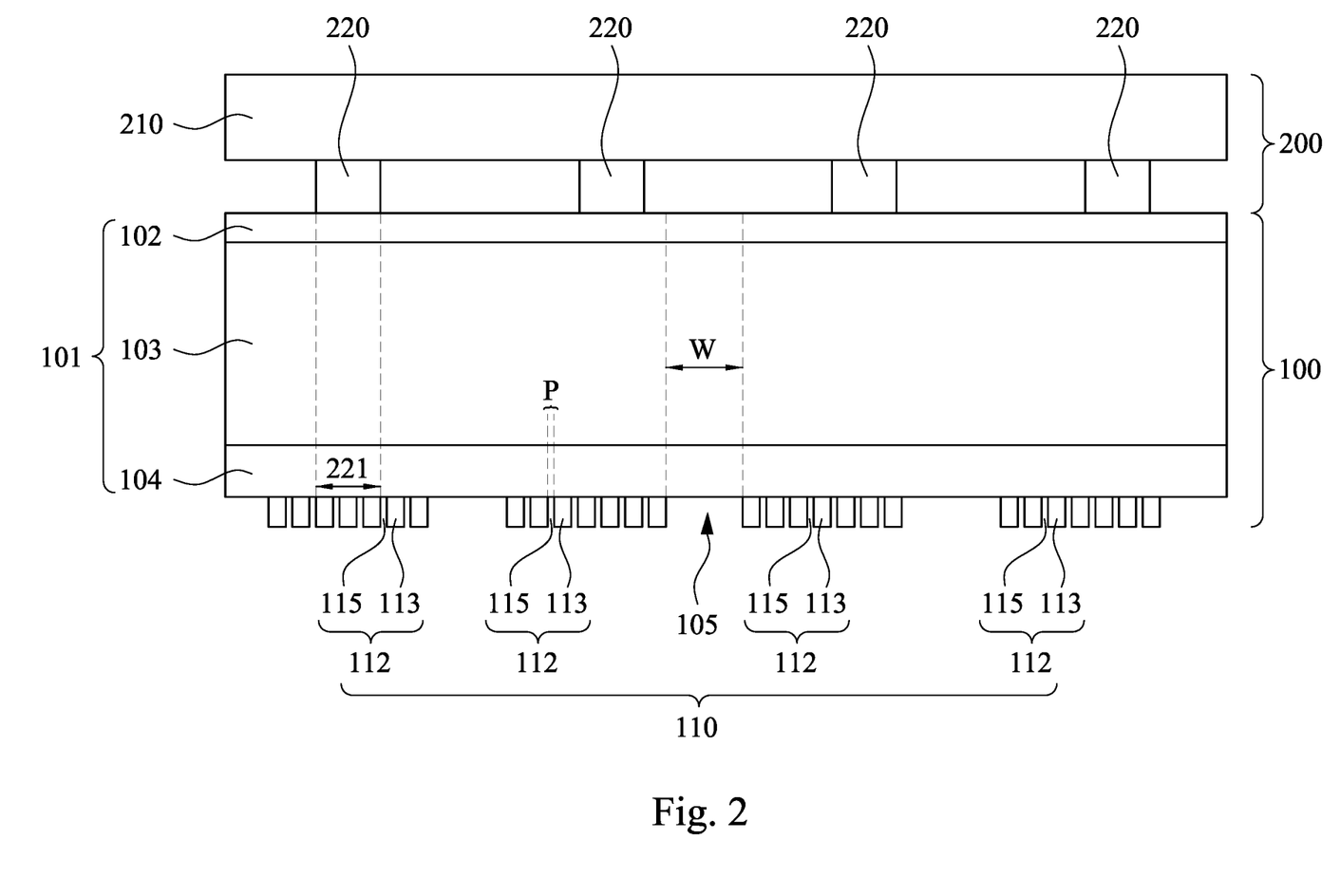
FIG. 2 is an enlarged view of a reticle mounted to a reticle stage.

Reference is made to FIG. 1 and FIG. 2. FIG. 2 is an enlarged view of a reticle mounted to a reticle stage. The reticle stage 200 is configured to secure the reticle 100 or the lithographic reticle. In some embodiments, the reticle stage 200 includes an electrostatic chuck (e-chuck) to secure the reticle 100 by an electrostatic potential. The e-chuck is used because the gas molecules may absorb EUV light and the lithography system 10 for the EUV lithography patterning is maintained in a vacuum environment to avoid EUV intensity loss. In some embodiments, the reticle stage 200 includes a substrate 210 and plural burls 220 on a surface of the substrate 210, and the reticle stage 200 secures the reticle 100 by the burls 220.

In the present embodiment, the reticle 100 is a reflective reticle. The reticle 100 includes a base material 101 and a pattern layer 110 on a surface of the base material 101. The pattern layer 110 includes plural gratings 112. The base material 101 of the reticle 100 includes a chromium oxide containing layer 102, a low thermal expansion material (LTEM) layer 103 and a multilayer reflective material 104, in which the LTEM layer 103 is sandwiched between the chromium oxide containing layer 102 and the multilayer reflective material 104, and the gratings 112 are formed on the multilayer reflective material 104. In some embodiments, the LTEM layer 103 may be formed from quartz, glass, $TiO_2$, silicon, doped silicon, silicon carbide, silicon oxide-titanium oxide alloy, combinations thereof, other suitable materials or the like. In some embodiments, the multilayer reflective material 104 includes a plurality of film pairs, such as molybdenum-silicon (Mo/Si) film pairs (e.g., a layer of molybdenum above or below a layer of silicon in each film pair). In other embodiments, molybdenum, silicon and rubidium are used to form the multilayer reflective material 104. Alternatively, the multilayer reflective material 104 may include molybdenum-beryllium (Mo/Be) film pairs, or other suitable materials that are configurable to highly reflect the EUV light.

The gratings 112 of the pattern layer 110 may be formed by patterning an absorbing material layer (not shown) into plural absorbing layers 113, each of which is an elongated element and parallel to the adjacent absorbing layers 113. The absorbing layers 113 are spaced apart from one another by a groove 115 having a pitch P. In some embodiments, the pitch P may be in a range from about 20 nm to about 1000 nm for sufficient resolution of the optical image formed by the light directed from the reticle 100 toward the TIS 26. Two adjacent gratings 112 are spaced apart from each other by a gap 105, in which the gap 105 has a width W in a range from about 3 um to about 2 mm for precise detection of the intactness of the burls. The absorbing layers 113 may be formed from an opaque material. In some embodiments, the opaque material includes tantalum-based materials with essentially no oxygen, such as tantalum silicide-based materials (TaSi), nitrogenized tantalum boride-based materials (TaBN), and tantalum nitride-based materials (TaN). In some other embodiments, the opaque material includes tantalum- and oxygen-based materials, such as oxidized and nitrogenized tantalum and silicon-based materials (TaSiON), tantalum boron oxide-based materials (TaBO), and oxidized and nitrogenized tantalum-based materials (TaON). In other embodiments, the opaque material includes chromium. For example, the absorbing layers 113 may have a substantially zero transmission. The absorbing layers 113 of the gratings 112 and the multilayer reflective material 104 (including the groove 115 between two absorbing layers 113 and the gap 105 between two adjacent gratings 112) together form the pattern layer 110 of the reticle 100. The absorbing layers 113 are dark and reflect only a very small portion of the incident light beam onto the semiconductor wafer 22, but light beams that impinge upon the multilayer reflective material 104 are reflected to the substrate being patterned or the TIS 26.

Furthermore, as shown in FIG. 2, each burl 220 is aligned with one of the gratings 112. The term of "aligned with" may indicate that the a projection 221 of one of the burls 220 on the surface of the base material 101 is overlapped with at least a part of one of the gratings 112. In certain embodiments, the burls 220 are directly under the gratings 112, respectively. Because the intactness of the burls 220 are detected using the optical image obtained from an intensity distribution of the light directed from the gratings 112, the alignment of the burls 220 and the gratings 112 (or overlapping the projection 221 with the gratings 112) is advantageous to the precise detection of the intactness of the burls 220.

The projection optics module (or projection optics box (POB)) 20 is configured for imaging a pattern of the lithographic reticle onto a semiconductor wafer 22 secured on a substrate stage 24 of the lithography system 10, in some embodiments. In other embodiments, the POB 20 is configured for enabling the TIS 26 arranged beside the semiconductor wafer 22 on the substrate stage 24 to receive the light directed from the reticle 100, such that intactness of the reticle stage 200 can be detected. In some embodiments, the POB 20 has refractive optics (such as for a UV lithography system) or alternatively reflective optics (such as for an EUV lithography system) in various embodiments. The light directed from the reticle (e.g., the reticle 100 or the lithographic reticle), carrying the image of the pattern defined on the reticle, is collected by the POB 20. The illuminator 14 and the POB 20 are collectively referred to as an optical module of the lithography system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor wafer 22 is coated with a photoresist layer sensitive to the EUV light in the present embodiment. Various components including those described above are integrated together and are operable to perform lithography exposing processes.

Figure 3A:
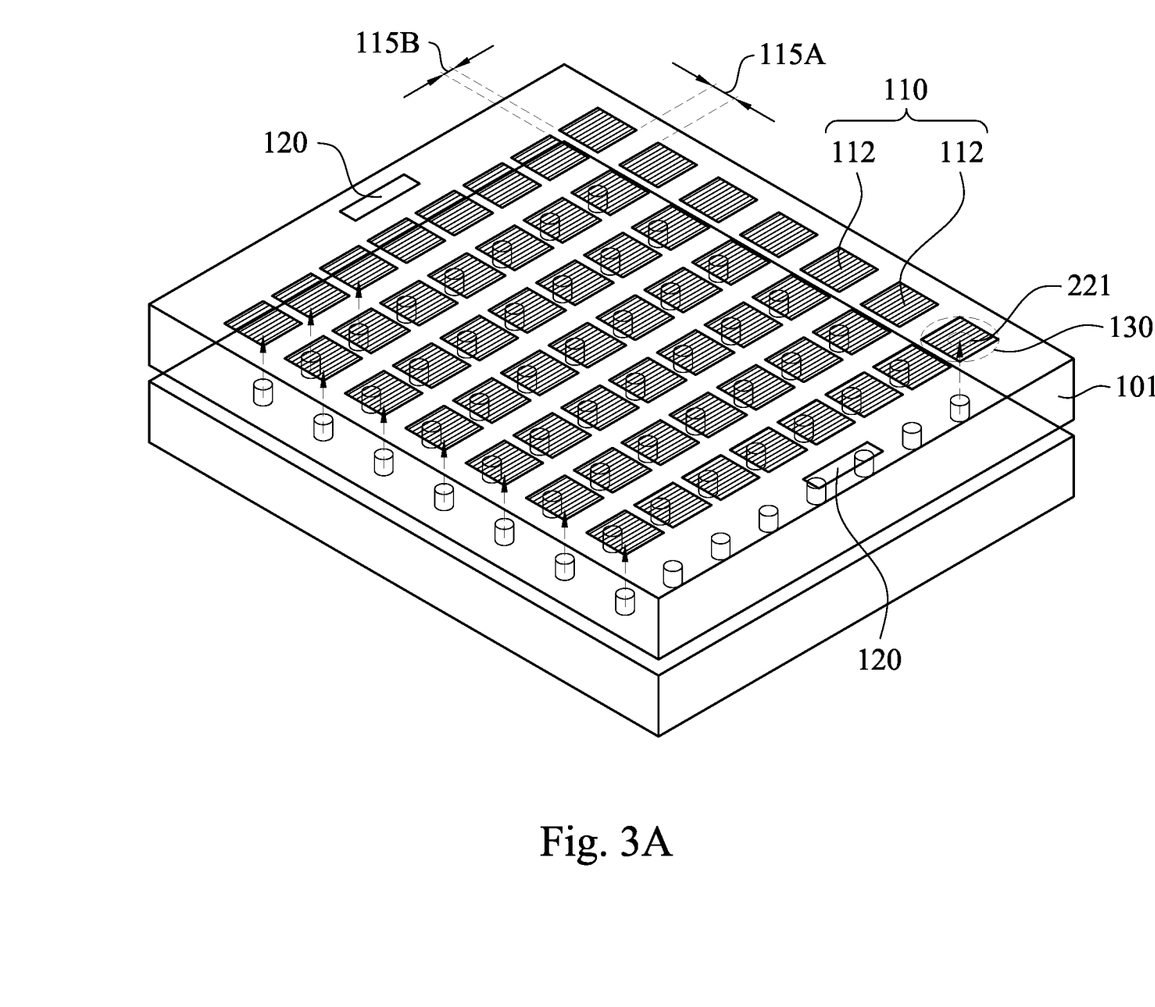
FIG. 3A is a 3-D view of a reticle mounted on a reticle stage in accordance with some embodiments of the present disclosure.

A TIS 26 is a sensor that is used to measure a 3-D projected aerial image of the pattern layer 110 (FIG. 2) of the reticle 100. The aerial image is defined as an intensity distribution of the light at the TIS 26. The pattern layer 110 of the reticle 100 may be a line pattern with a line width (as shown in FIG. 3A) comparable to the wavelength of the exposure radiation. That is, the pattern layer 110 of the reticle 100 may include gratings 112. The TIS 26 measures the pattern layer 110 of the reticle 100 using a transmission pattern with a photocell underneath it. The sensor data may be used to measure the position of the reticle 100 with respect to the substrate stage 24 in six degrees of freedom, i.e. three degrees of freedom related to translation and three degrees of freedom related to rotation. Moreover, magnification and scaling of the projected image may be measured.

The damages on the burls 220 (FIG. 2) or particles adhering to the burls 220 may change the position of the reticle 100 with respect to the substrate stage 24, and thus the intactness of the burls 220 can be detected based on the 3-D projected aerial image, which is obtained by using the TIS 26 and the reticle 100.

The lithography system 10 may further include other modules or be integrated with (or be coupled with) other modules. In the present embodiment, the lithography system 10 includes a gas supply module 28 designed to provide hydrogen gas to the light source 12. The hydrogen gas helps reduce contamination in the light source 12.

Figure 3B:
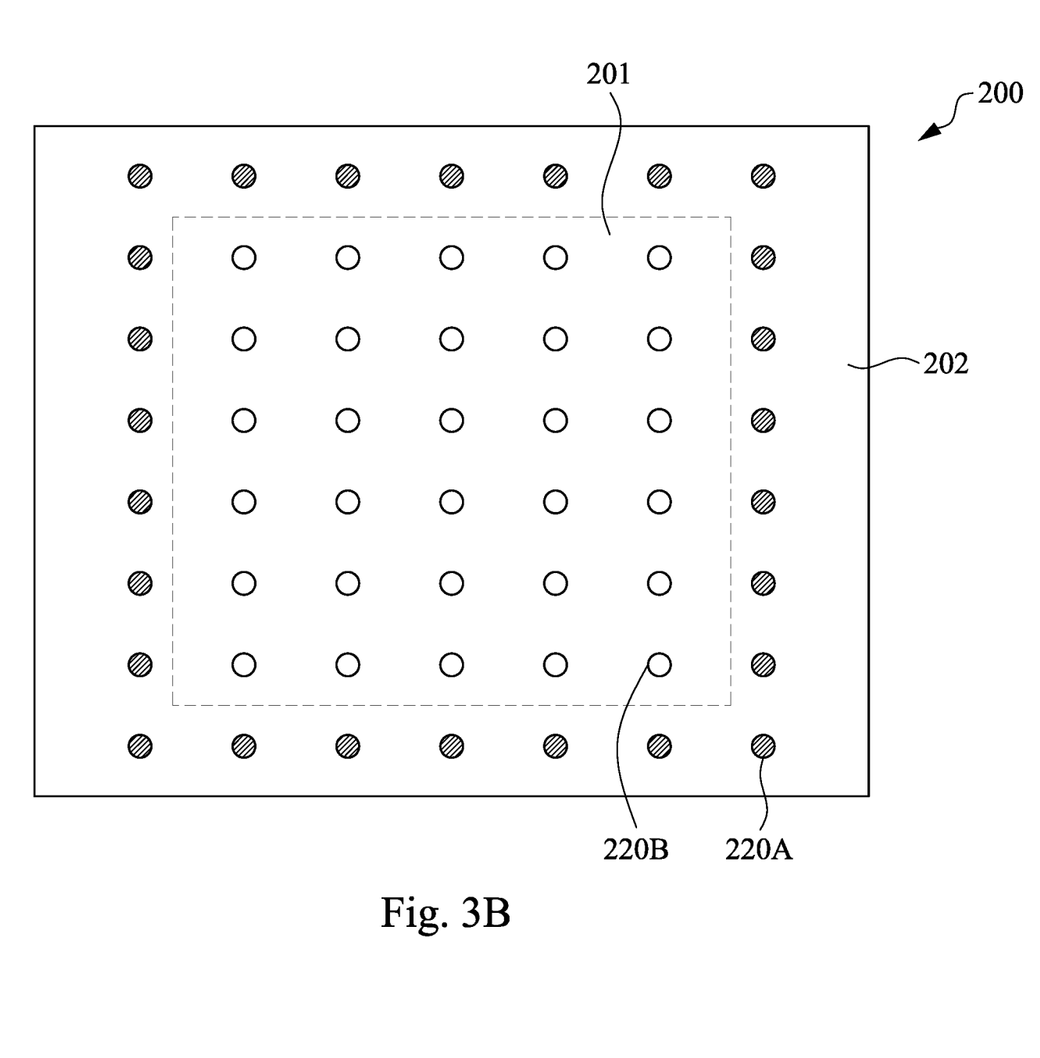
FIG. 3B is a top view of a reticle stage.

Reference is made to FIG. 3A and FIG. 3B. FIG. 3A is a 3-D view of a reticle mounted on a reticle stage in accordance with some embodiments of the present disclosure. FIG. 3B is a top view of a reticle stage. A relative position of the reticle 100 and the reticle stage 200 is upside down from the position shown in FIG. 2 for clear understanding. The reticle 100 includes the line pattern layer 110 that includes the gratings 112. In the embodiments of FIG. 3A, the gratings 112 are regularly arranged and uniformly distributed on the surface of the base material 101, in which the gratings 112 are spaced from one another by a lateral gap 115A or a vertical gap 115B. The term of "regularly arranged" represents that each of the gratings 112 is vertically and laterally aligned with its adjacent gratings 112. The term of "uniformly distributed" represents that the gratings 112 are arranged everywhere on the surface of the base material 101 instead of merely being arranged on a particular region. For example, as shown in FIG. 3B, the burls 220 include first burls 220A and second burls 220B, in which the second burls 220B are disposed on a center 201 of the reticle stage 200 and the first burls 220A are disposed on an edge 202 of the reticle stage 200. The center 201 and the edge 202 of the reticle stage 200 are merely defined for showing relative positions of the first and second burls 220A and 220B, and may not be regions practically existing on the reticle stage. In the embodiments of FIG. 3A, both the first burls 220A and the second burls 220B are vertically aligned with one of the gratings 112.

A width of the lateral gap 115A may be the same as a width of the vertical gap 115B in some embodiments. The width of the lateral gap 115A may be different from the width of the vertical gap 115B in other embodiments. Each of the lateral gap 115A and the vertical gap 115B may have the width in a range from about 3 um to 2 mm for the precise detection of the intactness of the burls. Other arrangements of the gratings 112 are also applicable according the design of the burls 220 of the reticle stages 200.

As described in FIG. 2, one of the burls 220 is aligned with one of the gratings 112, such that the projections 221 of the burls 220 can be at least partially overlapped with the gratings 112. In some embodiments, the projections 221 of the burls 220 is completely overlapped with the gratings 112; that is, an area of one of the gratings 112 is greater than an area of one of the burls 220. It is noted that an area of the gratings 112 may be adjusted depending on requirements or designed of the reticle 100. In some embodiments, the reticle 100 further includes one or more alignment marks 120 arranged on two opposing sides of the reticle 100. For example, the alignment marks 120 are used, such that the burls 220 can be aligned with the gratings 112. In other embodiments, the alignment marks 120 may be also used, such that the reticle 100 can be aligned with the semiconductor wafer 22 (FIG. 1). In some embodiments, the alignment marks 120 are used in a photo alignment process.

In FIG. 3A, one of the burls 220 is aligned with only one grating 112 in a circle 130, in which the area of each of the gratings 112 is substantially greater than the area of each burls 220. In other embodiments, plural gratings form a repeat unit of the grating 112 in the circle 130. That is, the intactness of each of the burls 220 may be detected by using the repeat unit having multiple gratings. FIG. 4 to FIG. 8 show different configurations of a repeat unit of gratings in accordance with some embodiments of the present disclosure.

Figure 4:
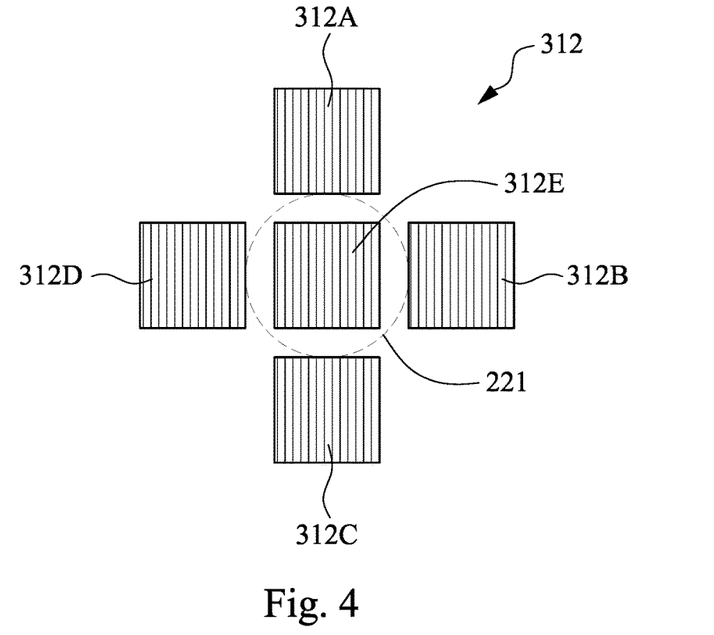
FIG. 4 to FIG. 8 show different configurations of a grating in accordance with some embodiments of the present disclosure.

Please refer to FIG. 2 and FIG. 4 first, a repeat unit 312 of gratings 312A-312E is provided. As shown in FIG. 4, the projection 221 of one of the burls 220 is surrounded by the gratings 312A-312D, and a grating 312E is disposed in the middle of the projection 221 and partially overlapped with the projection 221. In some embodiments, the grating 312A and the grating 312C are respectively arranged on two opposing sides of the grating 312E, and the grating 312B and the grating 312D are respectively arranged on the other two opposing sides of the grating 312E, in which the gratings 312A-312E form a cross shape with four arms of equal length. In certain embodiments, a side of each of the gratings 312A-312D that contacts a circumference of the projection 221 is tangent to the projection 221. In some embodiments, a distance between one of the gratings 312A-312D and the grating 312E is substantially same as a distance between the other one of the gratings 312A-312D and the grating 312E. In some embodiments, an area of the grating 312E is substantially same as an area of each of the gratings 312A-312D. In other embodiments, the area of the grating 312E may be greater or smaller than the area of each of the gratings 312A-312D. The area of each of the grating 312A-312E may be determined according to the area of the projection 221, a shape of the projection 221 or other conditions.

Figure 5:
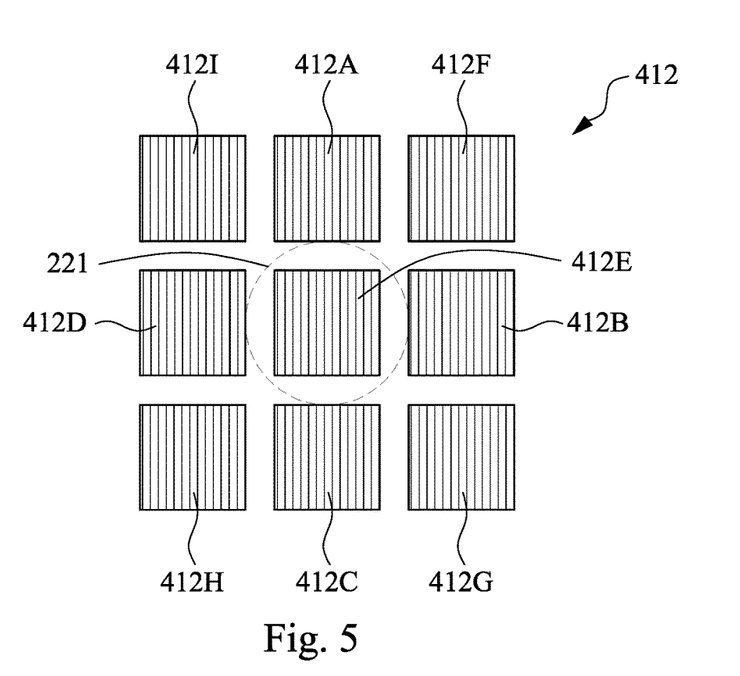

Please refer to FIG. 2 and FIG. 5, a repeat unit 412 of gratings 412A-412I is provided. As shown in FIG. 5, the projection 221 of one of the burls 220 is surrounded by the gratings 412A-412D and 412F-412I, and a grating 412E is disposed in the middle of the projection 221 and partially overlapped with the projection 221. An arrangement of the gratings 412A-412E is similar to the arrangement of the gratings 312A-312E of FIG. 4, and may be repeated herein. In some embodiments, the gratings 412F-412I are arranged, such that the repeat unit 412 forms a 3×3 square. In other words, the grating 412F is arranged between the gratings 412A and 412B, the grating 412G is arranged between the gratings 412B and 412C, the grating 412H is arranged between the gratings 412C and 412D, and the grating 412I is arranged between the gratings 412D and 412A. In some embodiments, the gratings 412F-412I are not overlapped with the projection 221. However, the gratings 412F-412I may be overlapped with the projection 221 in other embodiments, according to the requirements or the design of the burls 220. A number of the gratings is not limited to 9 as shown in FIG. 5, the number may be 16, 25 and more, according to the area of the projection 221, the area of the grating or other conditions.

Figure 6:
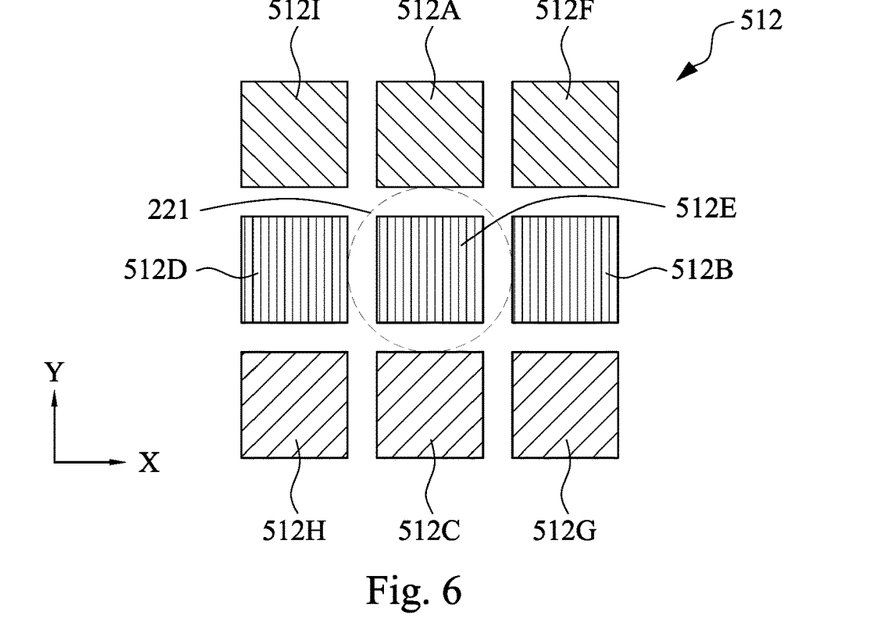

Please refer to FIG. 6, a repeat unit 512 of gratings 512A-512I is provided. An arrangement of the gratings 512A-512I is similar to the arrangement of the gratings 412A-412I, and may not be repeated herein. Compared to the gratings 312A-312E of FIG. 4 and the gratings 412A-412I of FIG. 5 which have grating grooves with the same orientation (e.g., parallel to an extending direction Y of one side of the gratings 312A-312E and 412A-412I), the gratings 512A-512I may have grating grooves with different orientations. In some embodiments, the gratings 512A, 512I and 512F have the grating grooves with a first orientation that is slant to the direction Y, and an included angle formed between this first orientation and the direction Y may be greater than 0° and less than 90°. In other embodiments, the gratings 512B, 512D and 512E have the grating grooves with a second orientation that is parallel to the direction Y. In further embodiments, the gratings 512C, 512G and 512H have the grating grooves with a third orientation that is slant to the direction Y, and an included angle formed between this third orientation and the direction Y may be greater than 0° and less than 90°. For example, the first orientation may have a negative slope, and the third orientation may have a positive slope. The grating grooves having an orientation parallel to the X direction are also applicable, though they're not illustrated in the figures. Other configurations of the orientations of the grating grooves may be used in other embodiments. The orientation may affect the resolution and sensitivity of the optical image of the pattern layer 110 of the reticle 100. Precision and time for detecting the intactness of the burls 220 may be further adjusted by arranging the configuration of the orientation of the gratings.

Figure 7:
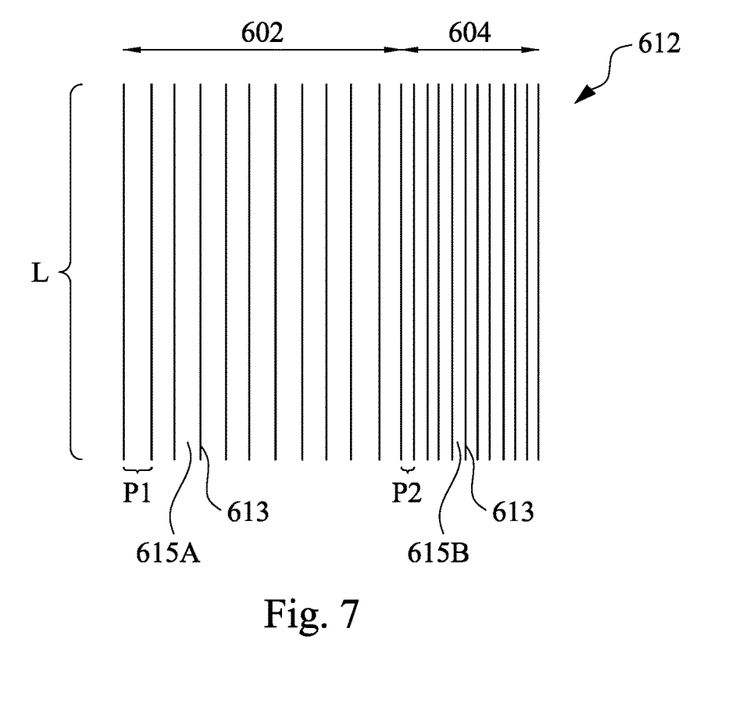

Reference is made to FIG. 7. FIG. 7 is a top view of a grating in accordance with some embodiments of the present disclosure. Similar to the absorbing layers 113 and the grating groove 115 in FIG. 2, a grating 612 may include plural absorbing layers 613, and grating grooves 615A and 615B having different pitches may respectively formed between two of the absorbing layers 613. For example, the grating grooves 615A in a portion 602 may have a pitch P1, and the grating grooves 615B in a portion 604 may have a pitch P2, and the pitch P1 is greater than the pitch P2. In some embodiments, the pitch P1 and the pitch P2 are respectively about 20 nm to about 1000 nm. In certain embodiments, the pitch P1 and the pitch P2 are respectively about 100 nm to about 500 nm. When the pitch is greater than about 1000 nm, the intactness of the burls 220 (FIG. 2) cannot be precisely detected using the reticle 100. In some embodiments, a length of the grating grooves 615A and 615B (or the absorbing layers 613) may be about 5 um to about 200 um. In certain embodiments, a length of the grating grooves 615A and 615B may be about 15 um to about 30 um. When the length of the grating grooves 615A and 615B is greater than about 200 um, the production of the reticle 100 may be time-wasting. However, when the length of the grating grooves 615A and 615B is smaller than 15 um, the gratings 612 cannot cover the projection of the burls, causing failure in detecting the intactness of the burls 220. FIG. 7 shows the grating having two different pitches, while a grating having three or more different pitches may be used in other embodiments.

Figure 8:
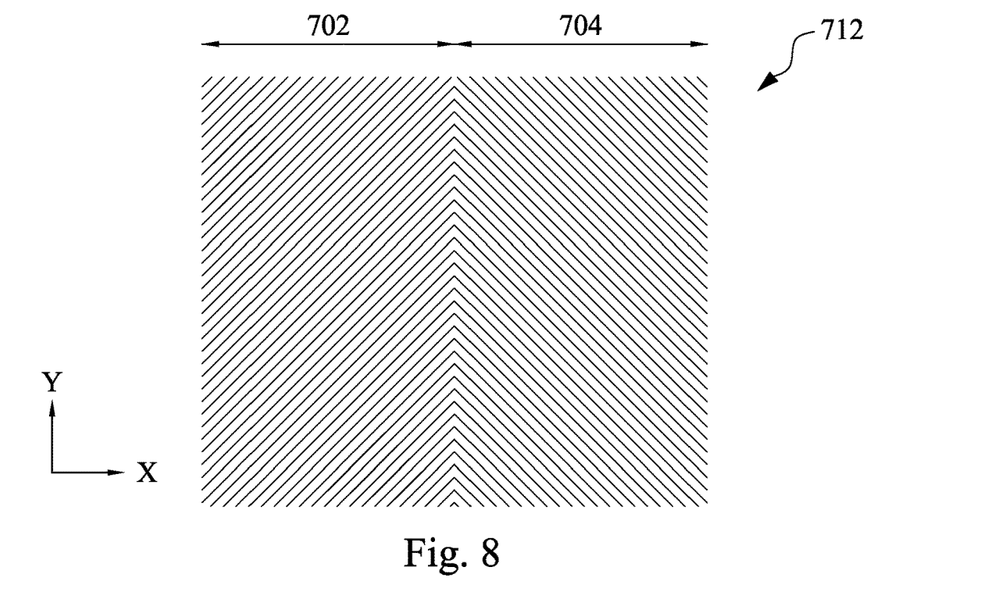

Reference is made to FIG. 8. FIG. 8 is a top view of a grating in accordance with some embodiments of the present disclosure. A grating 712 may include grating grooves (or the absorbing layers) that have different orientations, and both of these orientations are slant to the direction Y. For example, the grating grooves in a portion 702 may have the first orientation, the grating grooves in a portion 704 may have the second orientation, and the first orientation and the second orientation have different slopes.

Reference is made to FIG. 1 to FIG. 3B again. In some embodiments, before or after the lithography process is performed on the semiconductor wafer 22, the reticle 100 may be received on the reticle stage 200 instead of the lithographic reticle having a desired pattern for manufacturing a semiconductor device, and the light beam of the light source 12 is directed from the reticle 100 toward the TIS 26.

The gratings 112 are arranged to form a pattern upon illumination by the light beam in a cross section of the light beam. The pattern present in the cross-section of the light beam as a result of the gratings 112, passes through one or more lenses, e.g. through the illuminator 14 and PBO 20. The optical properties of the illuminator 14 and PBO 20 are such that the aerial image of the gratings 112 is formed. The aerial image of the gratings 112 relates with the intactness of the burls 220, and the intactness of the burls 220 can be detected.

The TIS 26 for transmission image detection is arranged to detect the aerial image of the gratings 112. The TIS 26 can move relatively to the position of the reticle 100 in at least three directions, e.g. three orthogonal directions X, Y and Z. By scanning along these three directions, an intensity of the aerial image can be mapped as a function of X, Y and Z-positions of the TIS 26. The resulting aerial image may be a 3-D image map (or so called 3-D projective aerial image), which includes coordinates of a location of each of the gratings 112 and the intensity distribution of the light corresponding to the location. The intensity distribution of the light may be affected by a focus depth of the light, and the focus depth of the light may be changed according to the arrangement of the reticle 100 onto the reticle stage 200. For example, when particles adhered to some of the burls 220, the gratings 112 of the reticle 100 corresponding to those burls 220 may be more protruded than the other gratings 112, and the protrusion leads to changes in a focus depth of the light beam directed from the reticle 100, causing 3-D images of the gratings 112 corresponding to the burls 220 where the particles adhere higher than the 3-D images of the other gratings 112. On the other hand, when there are damages on some of the burls 220, the heights of these burls 220 and their corresponding gratings 112 may be reduced, and the focus depth of the light beam directed from the reticle 100 is also changed, causing the 3-D images of the gratings 112 corresponding to the damaged burls 220 lower than the 3-D images of the other gratings 112. In other words, the intactness of the burls 220 are detected by the shapes and the heights of the 3-D images.

By using the aforementioned mapping, e.g. in the form of a 3D map, computation devices like processors or microprocessors connected to the TIS 26 may derive a position of the aerial image, e.g. by using a parabolic fit using a least squares fitting method. Such a computational device may be a processor, e.g. a processor or microprocessor in a dedicated processing device like a controller system or a general purpose computer system or other computer system, which can be programmably instructed to perform the mapping and associated computation. In some embodiments, a comparison operation may be performed, in which the data of the 3-D projective aerial image is compared to a data (i.e., a reference) collected by the same method when the burls 220 of the reticle stage 200 is wholly new. In other embodiments, this method can be applied to a long term monitoring to check reticle stage hardware module stability.

After detecting the burls 220 of the reticle stage 200, the reticle 100 is replaced with the lithographic reticle for forming the desired pattern on the photoresist layer over the semiconductor wafer 22. Then, the position of the substrate stage 24 is adjusted (or moved), such that the lithographic reticle having the desired pattern is aligned with the semiconductor wafer 22, so as to perform the lithography process of the manufacturing process.

Figure 9:
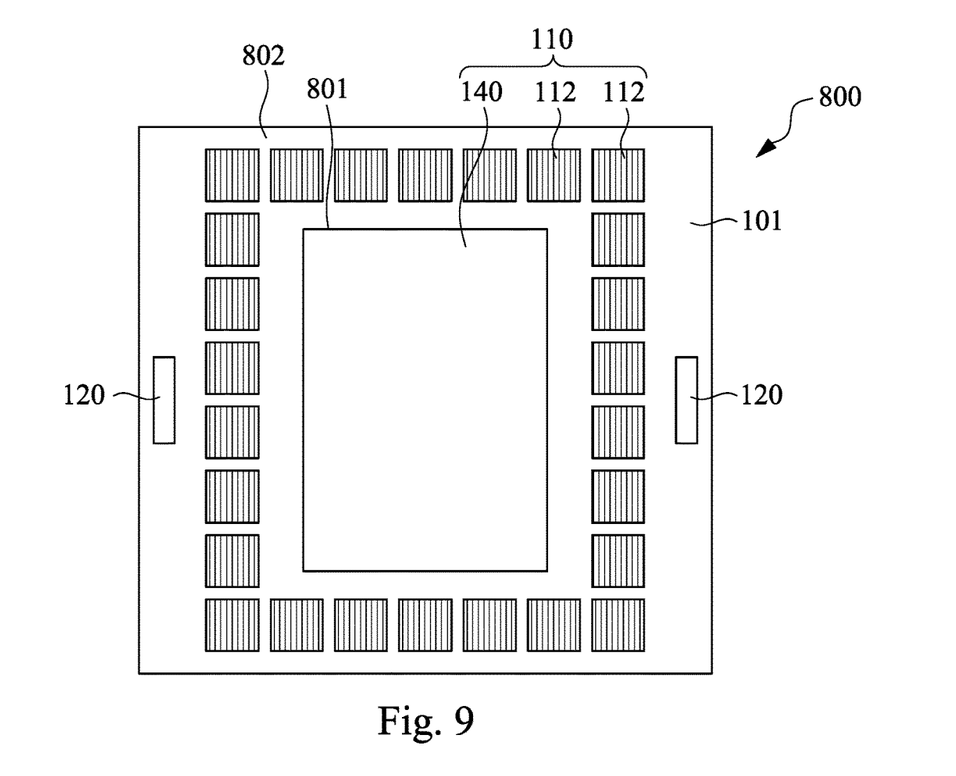
FIG. 9 is a top view of a reticle in accordance with some embodiments of the present disclosure.

Reference is made to FIG. 1 and FIG. 9. FIG. 9 is a top view of a reticle in accordance with some embodiments of the present disclosure. Elements in FIG. 9 that are similar to the elements in FIG. 1 to FIG. 3B may be labelled with the same reference numbers as those used in FIG. 1 to FIG. 3B. A reticle 800 includes the base material 101, the pattern layer 110 and the alignment marks 120. A patterning region 801 may be defined in a center of the reticle 800, and a detecting region 802 may be defined on an edge of the reticle 800. The gratings 112 and the alignment marks 120 are arranged in the detecting region 802. The pattern layer 110 further includes a predetermined pattern 140 arranged in the patterning region 801, such that the gratings 112 surround the predetermined pattern 140. The predetermined pattern 140 is used to pattern the photoresist layer over the semiconductor wafer 22 (FIG. 1), and the gratings 112 are used to detect the intactness of the first burls 220A (FIG. 3B).

When the reticle 800 is used, the detection of the burls 220 and the lithography process of the semiconductor wafer 22 may be performed using the same reticle, and thus an operation for replacing the reticle with the lithographic reticle is not required. For example, before the lithography process, the reticle 800 is arranged over the TIS 26, and the first burls 220A corresponding to the gratings 112 may be detected by the method described above. That is, in the embodiments of using the reticle 800 of FIG. 9, the intactness of the second burls 220B of FIG. 3B is not detected. Then, after the intactness of the first burls 220A is detected, the substrate stage 24 may move, such that the predetermined pattern 140 of the reticle 800 may be aligned with the semiconductor wafer 22 to perform the semiconductor manufacturing process. Generally, the first burls 220A on an edge of the reticle stage 200 are more easily damaged. A combination of the gratings 112 used for detecting the intactness of the burls 220 and the predetermined pattern 140 used for forming desired pattern on the semiconductor wafer 22 in the reticle 800 can effectively reduce time of the manufacturing process, and the first burls 220A arranged on the edge of the reticle stage 200 can be detected more often. Therefore, the quality of the patterned photoresist layer can be improved.

The pattern layer of the reticle of the present disclosure is design to have plural gratings that are respectively aligned with the burls of the reticle stages, so as to detect the intactness of the burls by using the optical image method. The development operation is not required in the optical image method, such that the method can be performed in-situ. Therefore, the method using the reticle of the present disclosure has advantages such as time saving, low costs and precisely showing the intactness of each of the burls.

In some embodiments, a reticle structure is provided. The reticle structure includes a reticle stage and a reticle mounted on the reticle stage. The reticle stage includes plural first burls and plural second burls, in which the second burls are disposed on a center of the reticle stage and the first burls disposed on an edge of the reticle stage such that the first burls surround the second burls. The reticle includes a base material and a pattern layer overlying the base material. The base material is secured on the first and second burls of the reticle stage. The pattern layer includes plural first gratings, and each of the first burls is vertically aligned with one of the first gratings.

In some embodiments, a lithography system is provided. The lithography system includes a light source, a reticle, a reticle stage, a semiconductor wafer stage and a transmission image sensor (TIS). The reticle includes a base material and a pattern layer overlying the base material. The pattern layer includes plural first gratings. The reticle stage includes plural burls for securing the reticle on the reticle stage, in which the burls are respectively aligned with the first gratings. The semiconductor wafer stage is configured to hold a semiconductor wafer. The TIS is disposed on the semiconductor wafer stage beside the semiconductor wafer, in which the reticle is configured to direct a light beam of the light source toward the TIS.

In some embodiments, a method of detecting intactness of a burl of a reticle stage. The method includes the following operations. First, a reticle is secured on plural burls of a reticle stage. The reticle includes a pattern layer having plural gratings, and the gratings are respectively aligned with the burls. A light beam is directed from the pattern layer of the reticle toward a transmission image sensor (TIS), such that a 3-D aerial image of the pattern layer is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle structure, comprising:
   a reticle stage comprising a plurality of first burls and a plurality of second burls, wherein the second burls are disposed on a center of the reticle stage and the first burls are disposed on an edge of the reticle stage such that the first burls surround the second burls; and
   a reticle mounted on the reticle stage, wherein the reticle comprises:
      a base material having a first surface secured on the first and second burls of the reticle stage; and
      a pattern layer overlying a second surface of the base material,
      wherein the pattern layer comprises a plurality of first gratings, each of the first burls is vertically aligned with one of the first gratings, each of the first gratings comprises a plurality of second gratings spaced apart from each other by a first distance, each of the second gratings comprises a plurality of absorbing features spaced apart from each other by a second distance, the first distance is greater than the second distance, and a vertical projection of each of the first burls on the second surface of the base material covers an entirety of one of the second gratings.

2. The reticle structure of claim 1, wherein the second gratings are arranged in a cross shape with four arms of equal length.

3. The reticle structure of claim 1, wherein the second gratings are arranged in a square shape.

4. The reticle structure of claim 1, wherein each of the first gratings has a plurality of grooves with a same orientation.

5. The reticle structure of claim 1, wherein an orientation of a plurality of grooves of one of the first gratings is different from an orientation of a plurality of grooves of another one of the first gratings.

6. The reticle structure of claim 1, wherein each of the second burls is vertically aligned with one of the first gratings.

7. The reticle structure of claim 1, wherein a patterning region is defined in a center of the reticle, a detecting region is defined to surround the pattern region, the first gratings are arranged in the detecting region, and a predetermined pattern for forming a semiconductor device is arranged in the patterning region.

8. The reticle structure of claim 1, wherein the first distance is in a range from about 3 um to about 2 mm.

9. A lithography system, comprising:
   a light source;
   a reticle comprising:
      a base material; and
      a pattern layer overlying a first surface of the base material,
      wherein the pattern layer comprises a plurality of first gratings;
   a reticle stage comprising a plurality of burls for securing a second surface of the reticle on the reticle stage, wherein the burls are respectively aligned with the first gratings, the first gratings are spaced apart from each other by a first distance, each of the first gratings comprises a plurality of absorbing features spaced apart from each other by a second distance, the first distance is greater than the second distance, and a vertical projection of each of the burls on the first surface of the base material is completely within one of the first gratings;
   a semiconductor wafer stage configured to hold a semiconductor wafer; and
   a transmission image sensor (TIS) disposed on the semiconductor wafer stage beside the semiconductor wafer, wherein the reticle is configured to direct a light beam of the light source toward the TIS.

10. The lithography system of claim 9, wherein each of the first gratings is a repeat unit comprising a plurality of second gratings.

11. The lithography system of claim 10, wherein the repeat unit has five second gratings, one of the second gratings is arranged in a middle of the vertical projection, two of the second gratings are arranged on two opposing sides of the one in the middle, and the other two of the second gratings are arranged on the other two opposing sides of the one in the middle.

12. The lithography system of claim 11, wherein a side of each of the two and the other two of the second gratings contacts a circumference of the vertical projection, and the side is tangent to the vertical projection.

13. The lithography system of claim 10, wherein the repeat unit has nine second gratings arranged as a 3×3 square, and the vertical projection is in a middle of the square.

14. The lithography system of claim 10, wherein at least one of the second gratings is free from coverage by the vertical projection of each of the burls on the first surface of the base material.

15. The lithography system of claim 10, wherein the vertical projection of each of the burls on the first surface of the base material covers an entirety of one of the second gratings.

16. The lithography system of claim 9, wherein the reticle comprises an alignment mark thereon.

17. A method of detecting intactness of a plurality of burls of a reticle stage, the method comprising:
   securing a monitor reticle on the burls of the reticle stage, wherein the monitor reticle comprises a pattern layer having a plurality of gratings, and the gratings are respectively aligned with the burls;

directing a light beam from the pattern layer of the monitor reticle toward a transmission image sensor (TIS), such that a 3-D aerial image of the pattern layer is formed;

replacing the monitor reticle with a lithography reticle; and performing, using the lithography reticle, a lithography process on a wafer.

18. The method of claim 17, further comprising:

comparing the 3-D aerial image of the pattern layer to a reference aerial image of the monitor reticle, such that intactness of the burls are detected.

19. The method of claim 18, further comprising:

after comparing the 3-D aerial image of the pattern layer to the reference aerial image of the monitor reticle moving a position of a semiconductor wafer stage where the TIS is disposed, such that the light beam is directed toward a semiconductor wafer beside the TIS over the semiconductor wafer stage.

20. The method of claim 19, further comprising:

exposing a photoresist layer over the semiconductor wafer to the light beam, such that a predetermined pattern of the monitor reticle is transferred to the photoresist layer.

* * * * *